United States Patent [19]
Fukiharu

[11] Patent Number: 5,952,894
[45] Date of Patent: *Sep. 14, 1999

[54] RESONANT CIRCUIT HAVING A REACTANCE FOR TEMPERATURE COMPENSATION

[75] Inventor: Eiichi Fukiharu, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/746,008

[22] Filed: Nov. 5, 1996

[30] Foreign Application Priority Data

Nov. 7, 1995 [JP] Japan .................................. 7-288239

[51] Int. Cl.$^6$ .............................. H03B 5/05; H03B 5/32; H03B 1/02; H03L 1/02
[52] U.S. Cl. .................... 331/176; 331/68; 331/108 D; 331/116 R; 331/158; 310/315; 310/318; 310/344
[58] Field of Search .................. 331/68, 108 D, 331/116 R, 116 FE, 158, 176; 310/315, 318, 344

[56] References Cited

U.S. PATENT DOCUMENTS

| | | | |
|---|---|---|---|
| 1,813,461 | 7/1931 | Nicolson | 310/318 X |
| 2,660,680 | 11/1953 | Koerner | 310/315 |
| 3,404,298 | 10/1968 | Roberts | 331/176 X |
| 3,796,968 | 3/1974 | Luscher | 331/67 |
| 3,808,556 | 4/1974 | Dome | 331/116 R |
| 3,969,640 | 7/1976 | Staudte | 310/318 X |
| 4,223,524 | 9/1980 | Nakagawa | 368/156 |
| 4,297,655 | 10/1981 | Fujii et al. | 331/176 X |
| 4,677,397 | 6/1987 | Nakayama et al. | 331/187 |
| 5,446,954 | 9/1995 | Knecht et al. | 310/344 X |
| 5,473,216 | 12/1995 | Brosig et al. | 310/344 X |
| 5,537,049 | 7/1996 | Oita et al. | 331/176 X |

FOREIGN PATENT DOCUMENTS

| | | |
|---|---|---|
| 0013525 | 1/1980 | Japan .................................. 310/315 |
| 62-241417 | 10/1987 | Japan . |
| 1 144 265 | 6/1967 | United Kingdom . |
| 1 304 680 | 1/1973 | United Kingdom . |
| 1 317 077 | 5/1973 | United Kingdom . |
| 1 450 237 | 9/1976 | United Kingdom . |
| 2 035 623 | 6/1980 | United Kingdom . |
| 1 576 704 | 10/1980 | United Kingdom . |
| WO 95/15577 | 6/1995 | WIPO . |

*Primary Examiner*—David Mis
*Attorney, Agent, or Firm*—Scully, Scott Murphy & Presser

[57] ABSTRACT

A resonant circuit of the present invention has a ceramic substrate, a quartz element provided on said substrate, and a capacitor for temperature compensation. Connection terminals are formed on the rear of the substrate in order to mount the resonant circuit to another substrate. A seam ring for air-tight sealing is positioned at the edges of the substrate. The quartz oscillator with this configuration can be mounted without resorting to leads.

18 Claims, 7 Drawing Sheets

5,952,894

RESONANT CIRCUIT HAVING A REACTANCE FOR TEMPERATURE COMPENSATION

BACKGROUND OF THE INVENTION

The present invention relates to a resonant circuit and, more particularly, to a resonant circuit including a reactance element for temperature compensation.

Generally, a resonant circuit has a quartz element and a capacitor, coil or similar reactance element and outputs a desired resonance frequency. The problem with this configuration is that the quartz element and reactance element must be mounted independently of each other, obstructing high-density mounting. Japanese Patent Laid-Open Publication No.62-241417, for example, proposes a resonant circuit as an approach to solve the above problem. However, the resonant circuit taught in this document uses leads, and is therefore not feasible for surface mounting. Moreover, this kind of resonant circuit cannot have its resonance frequency adjusted with respect to temperature variation and temperature characteristic after it has been sealed.

SUMMARY OF THE INVENTION

It is therefore an object of the present invention to provide a resonant circuit capable of reducing the width over which the serial resonance frequency-to-temperature characteristic of a quartz element varies with temperature.

In one aspect of the present invention, a resonant circuit has a quartz element and a reactance element. The reactance element has a primary temperature coefficient capable of reducing the width over which the serial resonance frequency-to-temperature characteristic of the quartz element varies with temperature.

Preferably, the reactance element is implemented by a capacitor for temperature compensation.

In another aspect of the present invention, a resonant circuit has a substrate, a leadless quartz element provided on the substrate, a chip capacitor provided on the substrate for the temperature compensation of the quartz element, and a seal member for sealing the substrate.

In accordance with the present invention, a resistor and a thermistor may be connected in parallel with the capacitor. The capacitor, resistor and thermistor do not need sealing which the quartz element needs. This allows the temperature characteristic to be freely adjusted after the sealing of the quartz element.

The reactance element connected to the quartz element may be suitably changed in order to reduce the width of temperature variation of the resonant circuit. The resonant circuit can be efficiently mounted to a substrate because it does not use any lead. Further, because the thermistor and capacitor are mounted on the substrate which is not sealed, the resistance of the thermistor and therefore the reactance of the circuit varies with ambient temperature. This allows the serial resonance frequency-to-temperature characteristic of the quartz element to follow the varying ambient temperature. As a result, the width of temperature variation of the resonant circuit is reduced.

BRIEF DESCRIPTION OF THE DRAWINGS

The above and other objects, features and advantages of the present invention will become apparent from the following detailed description taken with the accompanying drawings in which.

In the drawings, identical reference numerals denote identical structural elements.

DESCRIPTION OF THE PREFERRED EMBODIMENTS

Figure 1:
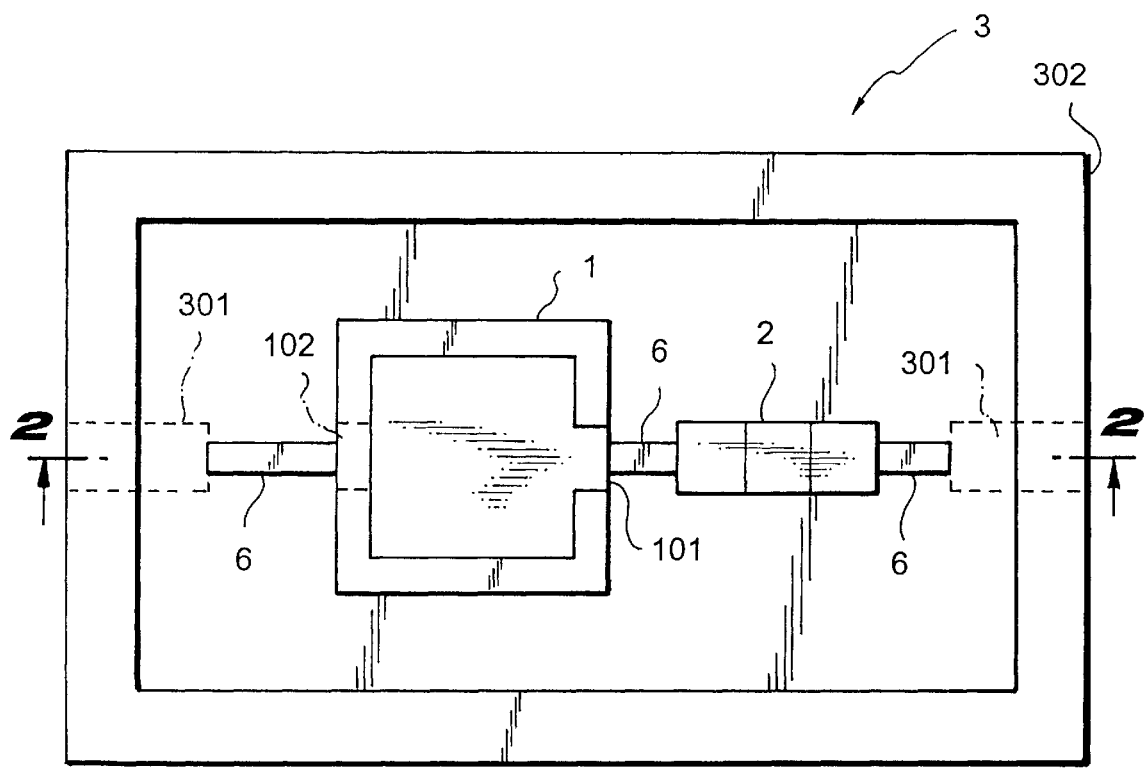
FIG. 1 is a plan view of a resonant circuit embodying the present invention.
Figure 2:
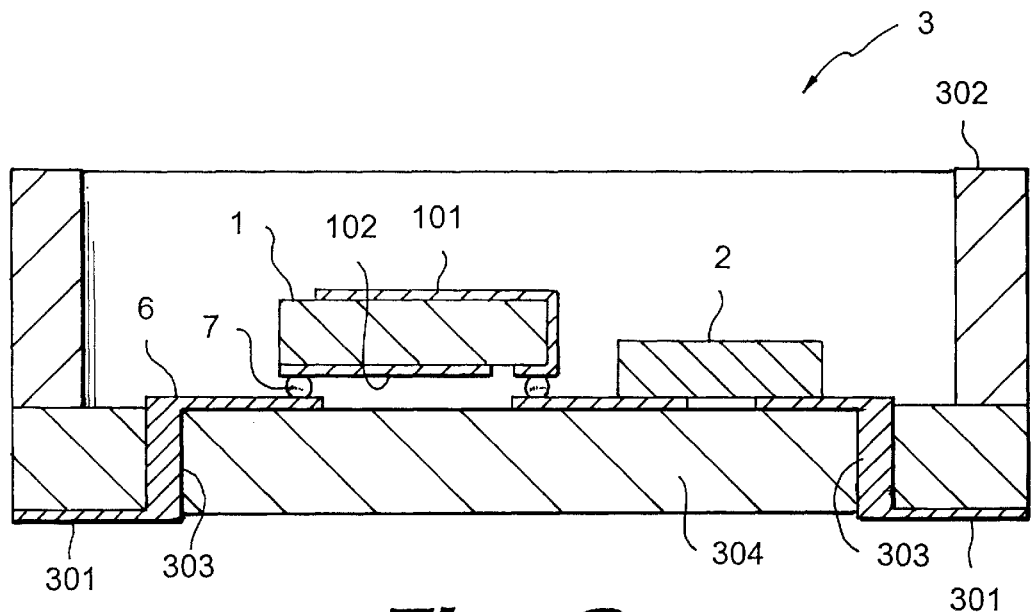
FIG. 2 is a section along line A–A' of FIG. 1.

Referring to FIGS. 1 and 2, a resonant circuit embodying the present invention and having a temperature compensation capability is shown. As shown, the resonant circuit has a quartz element 1 on which an upper electrode 101 and a lower electrode 102 are provided. The quartz element 1 is affixed to a ceramic substrate 304 with the electrodes 101 and 102 adhered by conductive adhesive 7. A capacitor 2 for temperature compensation is soldered or adhered to the substrate 304. A circuit pattern 6 connects the quartz element 1 and capacitor 2. Through holes 303 are formed in the substrate 304 while input/output terminals 301 are formed on the substrate 304. The circuit pattern 6 is connected to the input/output terminals 301 via the through holes 303. Also, the terminals 301 play the role of connection terminals when the resonant circuit is mounted to another substrate. A seam ring 302 is formed of Kovar which is an alloy consisting of 4% of Fe, 29% of Ni and 16% of Co. The seam ring 302 is provided at the edges of the substrate 304 by seal welding. A cover, not shown, is mounted on the seam ring 302 for air-tight sealing.

Figure 3:
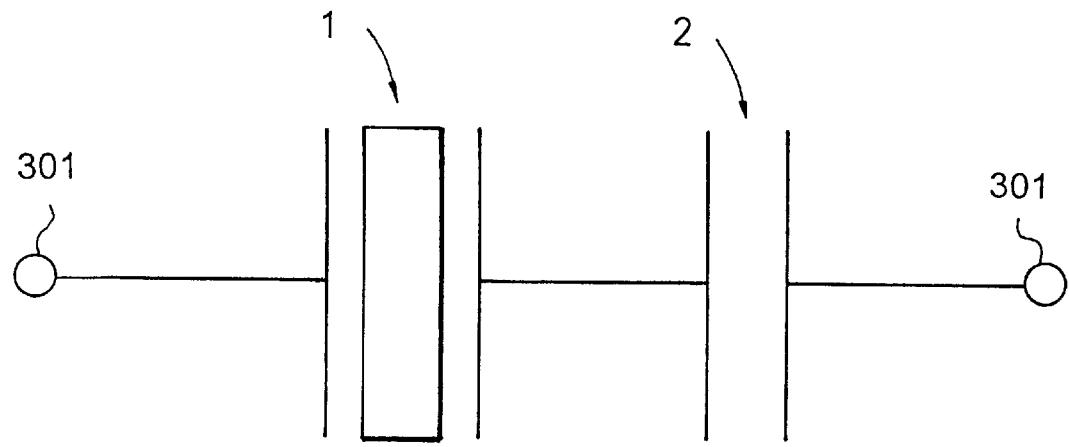
FIG. 3 shows an equivalent circuit representative of the resonant circuit of FIGS. 1 and 2.

FIG. 3 shows an equivalent circuit representative of the resonant circuit shown in FIGS. 1 and 2. As shown, the quartz element 1 and capacitor 2 are inserted between the input/output terminals 301 facing each other. The oscillator outputs a resonance frequency determined by the serial resonance frequency of the quartz element 1 and the capacitance of the capacitor 2.

Figure 4:
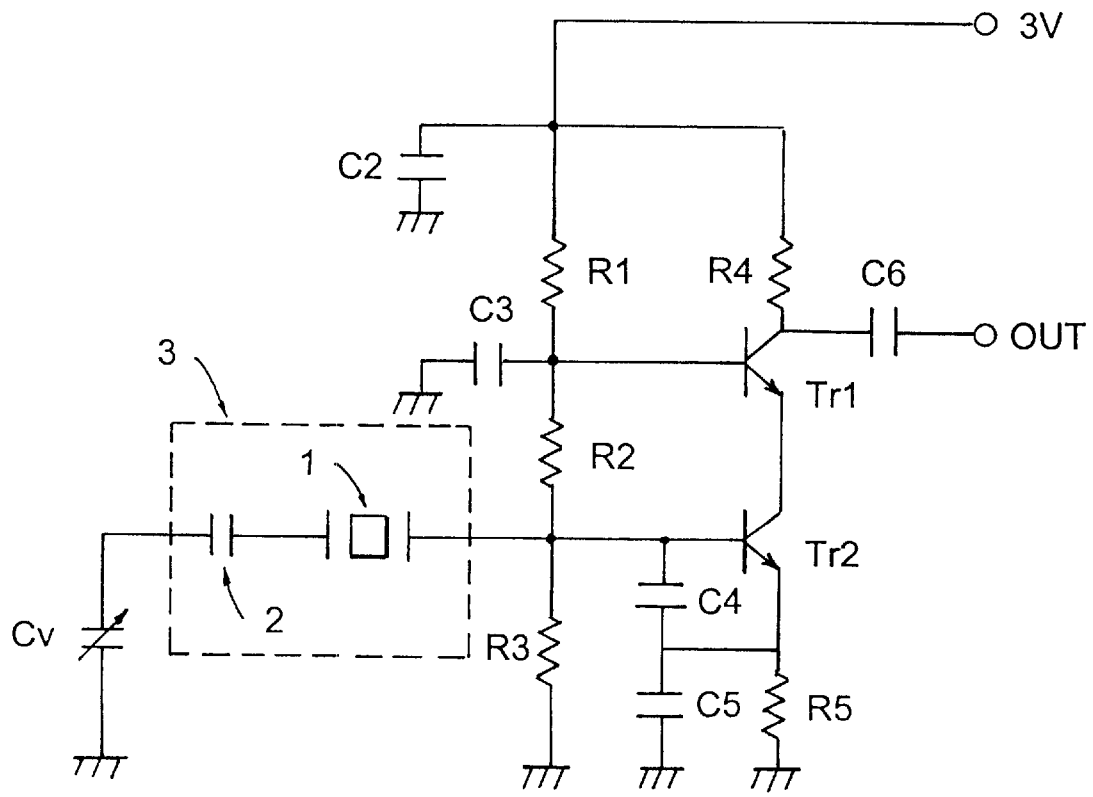
FIG. 4 is a circuit diagram showing a specific oscillation circuit to which the resonant circuit shown in FIG. 3 is applied.

An oscillation circuit including the resonant circuit shown in FIGS. 1 and 2 will be described with reference to FIG. 4. As shown, the oscillation circuit, implemented as a Colpitts oscillator, includes a resonant circuit 3 having the quartz element 1 and capacitor 2. One end of the resonant circuit 3 is connected to one end of a variable capacitor Cv the other end of which is connected to ground. The other end of the resonant circuit 3 is connected to one end of a resistor R3 and one end of a resistor R2. The other end of the resistor R3 is connected to ground while the other end of the resistor R2 is connected to one end of a capacitor C3. The other end of the capacitor C3 is connected to ground. A resistor R1 is connected at one end to the other end of the resistor R2 and one end of the capacitor C3. The other end of the resistor R1 is connected to a 3 V power source terminal. Also connected to the power source terminal are one end of a capacitor C2 and one end of a resistor R4. The other end of the capacitor C2 and that of the resistor R4 are respectively connected to the collector of a transistor Tr1 and ground. A capacitor C6 is connected at one end to the collector of the transistor Tr1. The oscillation frequency of the circuit is output via the other end of the capacitor C6. The transistor Tr1 has its base biased by the resistors R2 and R3 and has its emitter connected to the collector of a transistor Tr2. The base of the transistor Tr2 is biased by the resistor R3 and connected to ground via the capacitors C4 and C5. The emitter of the transistor Tr2 is connected to the capacitors C4 and C5 and connected to ground via the resistor R5.

When a 3 V DC voltage is input via the power source terminal, it turns on the transistors Tr1 and Tr2. As a result, the oscillation frequency of the oscillation circuit appears on an output terminal OUT.

Figure 5:
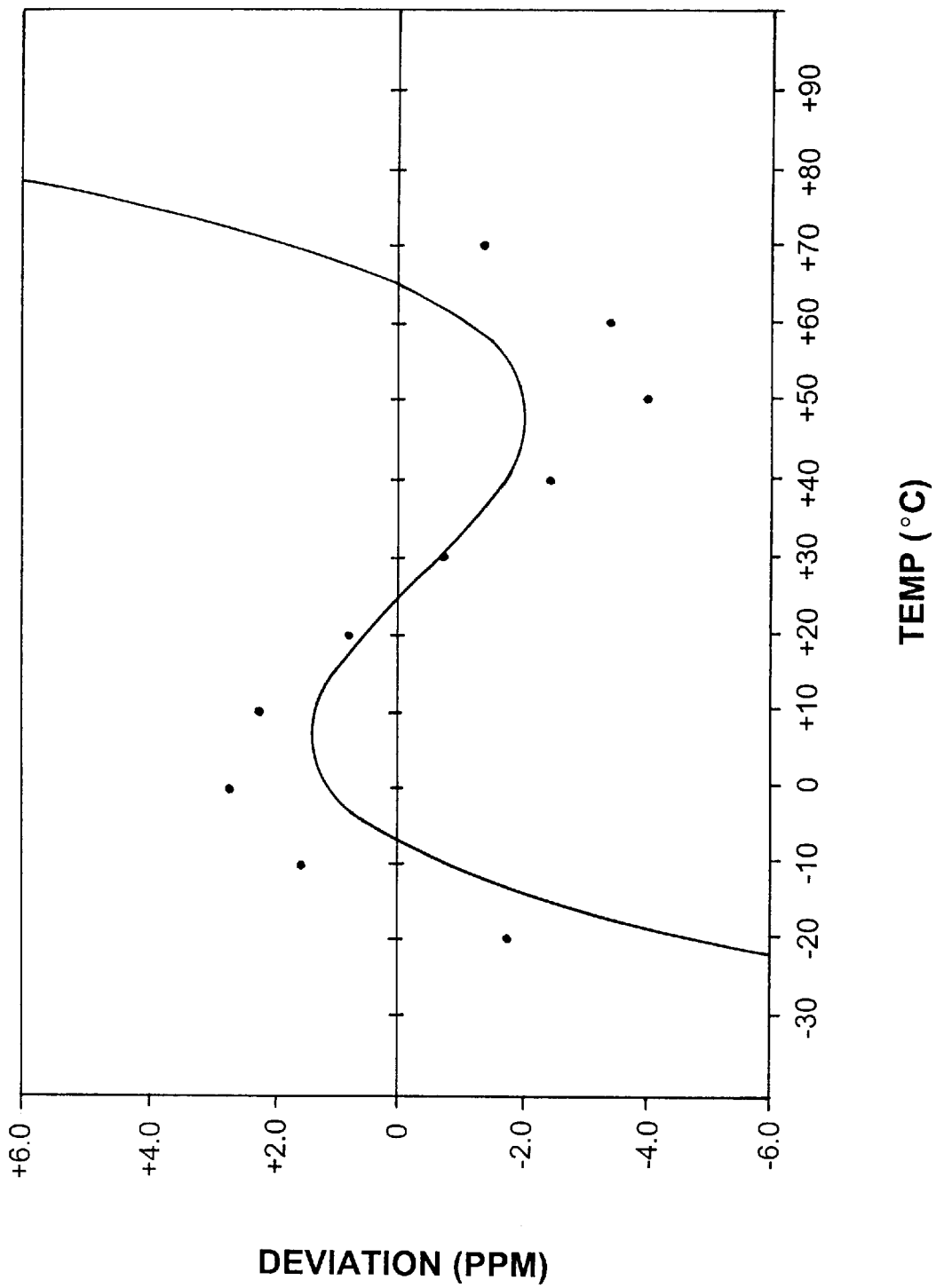
FIG. 5 is a graph showing the temperature variation of the resonant circuit shown in FIG. 4 and determined with a CH type capacitor.
Figure 6:
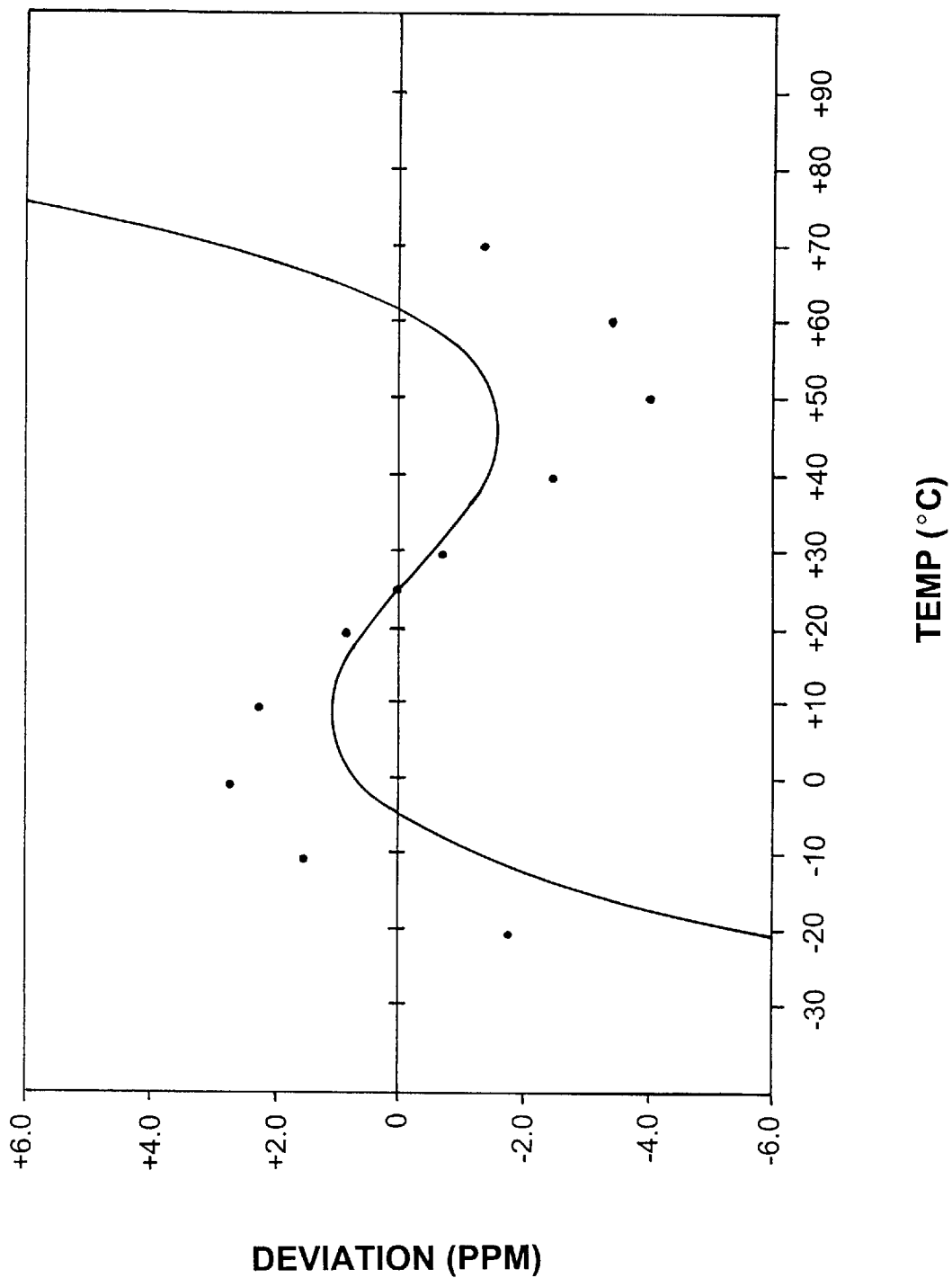
FIG. 6 is a graph showing the temperature variation determined with a UJ type capacitor.

Referring to FIGS. 5 and 6, the temperature dependency of the resonant circuit shown in FIG. 4 will be described. FIGS. 5 and 6 respectively show how the oscillation frequency varies in accordance with the ambient temperature when the capacitor 2 is implemented by a CH type capacitor and when it is implemented by a UJ type capacitor. A CH type capacitor and a UJ type capacitor respectively refer to a capacitor having a primary temperature coefficient of approximately zero and a capacitor having a primary temperature coefficient of negative value. Specifically, FIG. 5 shows the result of simulation effected with a CH type capacitor whose primary temperature coefficient is 0 PPM/°C. FIG. 6 shows the result of simulation effected with a UJ type capacitor whose primary temperature coefficient is 750 PPM/°C.

In accordance with the present invention, attention was paid to the fact that when a reactance element, e.g., a capacitor, is connected to a quartz element, the temperature coefficient of the serial resonance frequency-to-temperature characteristic of the quartz element varies, depending on the primary temperature coefficient of the reactance element. A series of extended researches showed that by selecting the reactance element adequately, it is possible to reduce the temperature dependency of the resonance frequency of the resonant circuit consisting of the quartz element and reactance element. It was also found that the primary temperature coefficient of the oscillation frequency of the resonant circuit depends on the impedance of the quartz element and that of a load.

In each of FIGS. 5 and 6, dots are representative of a case wherein the capacitor 2 was not connected the resonant circuit 3 and not replaced with a CH type or a UJ type capacitor. As FIG. 5 indicates, a CH type capacitor reduces the temperature variation of the frequency in a temperature range of from −10° C. to 60° C. Also, as FIG. 6 indicates, a UJ type capacitor reduces the temperature dependency of the frequency over the above temperature range. In FIGS. 5 and 6, the frequency of the serial resonance frequency-temperature characteristic of the quartz element 1 varies over a range of from −4.0 ppm to +2.8 ppm. The range of temperature variation is from −2.0 ppm to +1.3 ppm when use is made of a CH type capacitor or from −1.6 ppm to +1.0 ppm when use is made of a UJ type capacitor. This indicates that the capacitor 2 connected to the quartz element 1 reduces the width of frequency variation of the oscillation circuit. Particularly, the UJ type capacitor provides the largest reduction of the frequency variation width.

Figure 7:
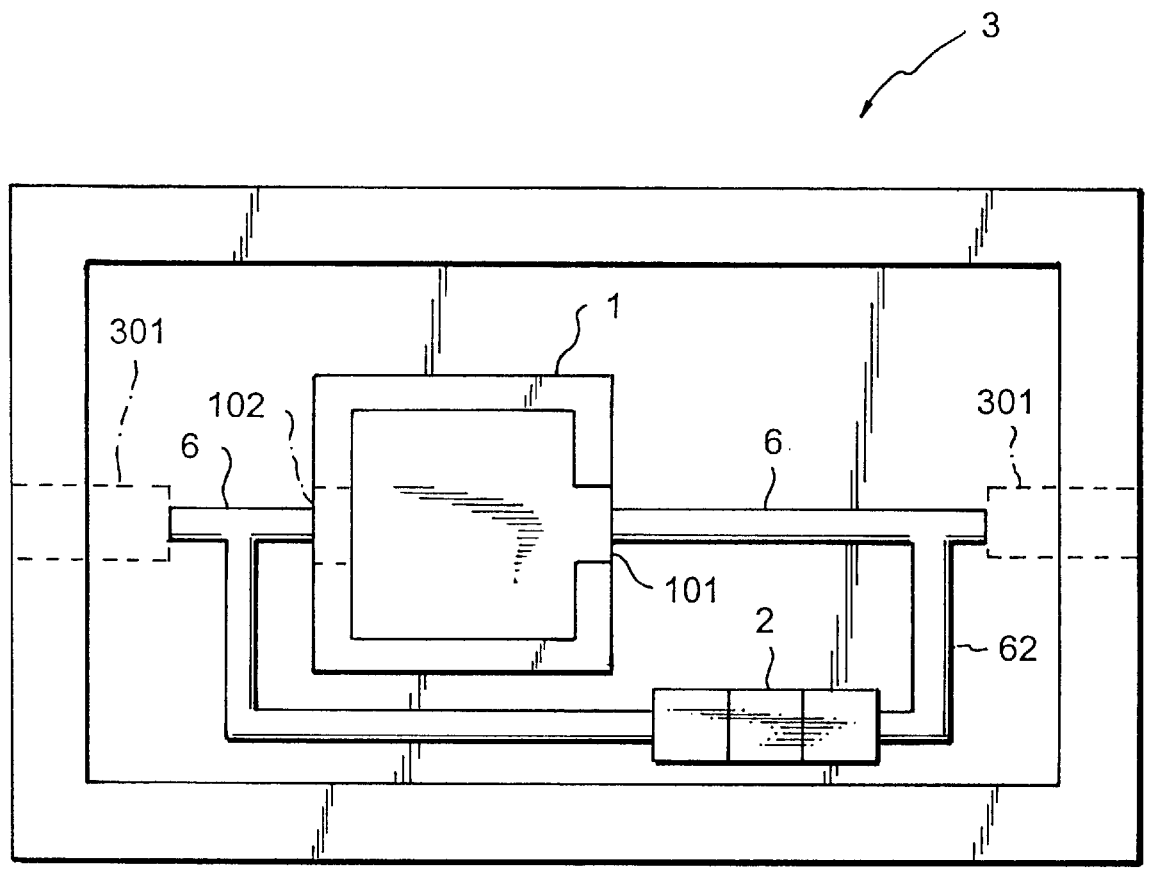
FIG. 7 is a plan view showing an alternative embodiment of the present invention.

FIG. 7 shows an alternative embodiment of the present invention. As shown, the capacitor 2 is connected in parallel with the quartz element 1. The rest of the construction is identical with the previous embodiment and will not be described in order to avoid redundancy.

Figure 8:
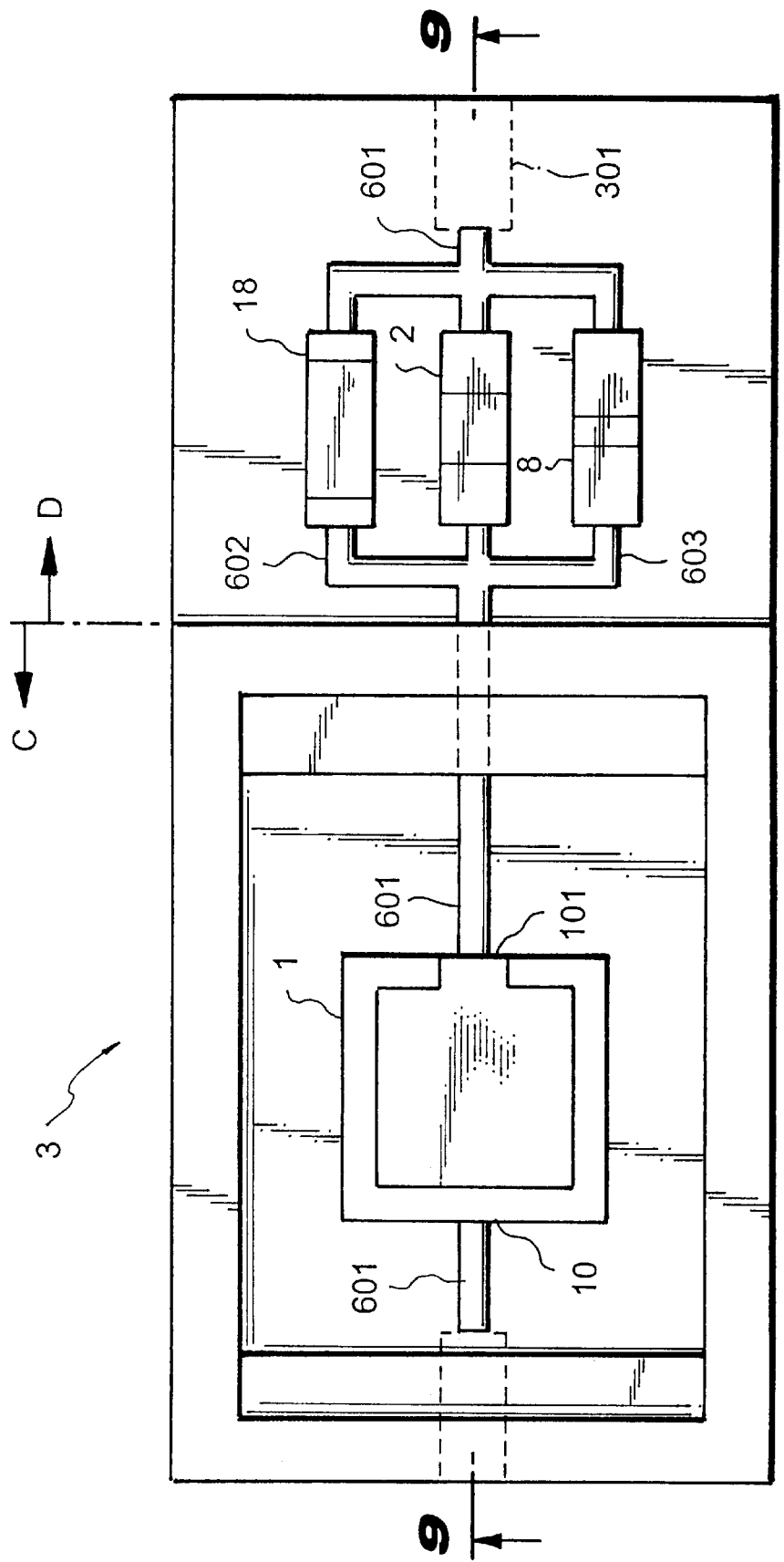
FIG. 8 is a plan view showing another alternative embodiment of the present invention.
Figure 9:
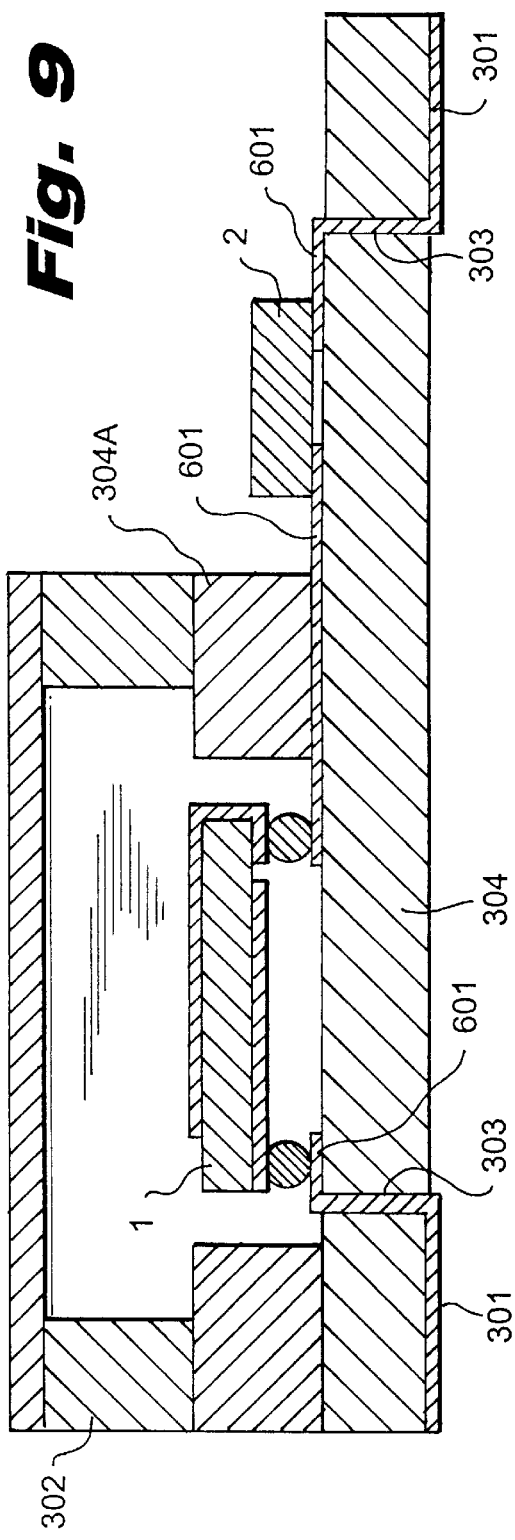
FIG. 9 is a section along line B–B' of FIG. 8.

FIGS. 8 and 9 show another alternative embodiment of the present invention. As shown, the resonant circuit 3 has a ceramic substrate 304 to be subjected to air-tight sealing later, and a another ceramic substrate which will not be subjected to air-tight sealing. These substrates are formed integrally with each other and are positioned at sides indicated by arrows C and D, respectively. In this sense, the substrate 304 and the other substrate will be referred to as a C substrate and a D substrate, respectively.

Input/output terminals 301 are provided on the rear of the C substrate 304. Likewise, input/output terminals 301 are provided on the rear of the D substrate and face the terminals 301 of the C substrate 304. The quartz element 1 and capacitor 2 are electrically connected to the C substrate 304 and D substrate by an electrode pattern 601. A resistor 18 and a thermistor 8 are connected to the D substrate in parallel with the capacitor 2 by patterns 602 and 603. Through holes 303 are formed in the C substrate and D substrate and connect the two substrates to the input/output terminals 301. The terminals 301 play the role of connection terminals when the resonant circuit 3 is mounted to a circuit board, not shown. A seam ring 302 surrounds the C substrate and is formed of Kovar. In the event of air-tight sealing, a cover also formed of Kovar is mounted to the seam ring 302 by seam welding, although not shown specifically. Another ceramic substrate 304A is laminated on the substrate 304 in order to prevent the pattern 601 from contacting the seam ring 302.

Figure 10:
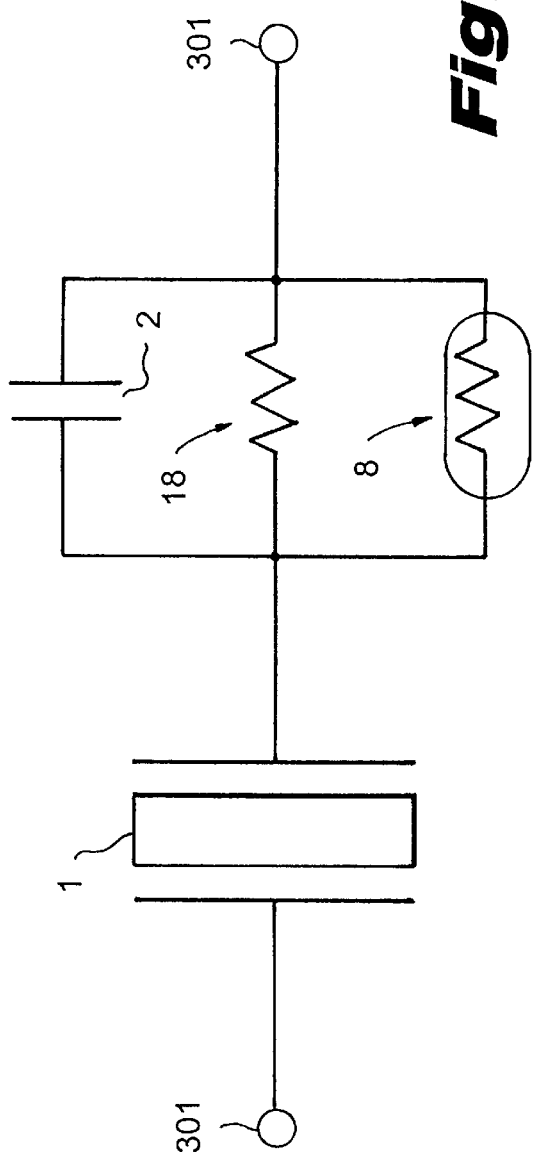
FIG. 10 shows an equivalent circuit representative of a resonant circuit shown in FIGS. 8 and 9.

FIG. 10 shows an equivalent circuit representative element 1, a thermistor 8 and a resistor 18 are connected between the input/output terminals 301, the quartz element 1 is connected to the parallel combination of the capacitor 2, a thermistor 8 and a resistor 18. The resonant circuit 3 outputs a resonance frequency determined by the equivalent circuit constant of the quartz element 1 and a reactance component constituted by the capacitor 2, resistor 18 and thermistor 8.

In the above configuration, the resistance of the thermistor 8 varies in accordance with the ambient temperature. Because the variation of the resistance of the thermistor 8 is equivalent to the variation of the reactance component consisting of the capacitor 2, resistor 18 and thermistor 8, the temperature characteristic of the reactance component varies. As a result, the temperature coefficient of the serial resonance frequency-to-temperature characteristic of the quartz element 1 varies and can follow the variation of the ambient temperature.

For the reactance element, use may be made of a coil 1 in place of the capacitor 2, if desired. Also, a posistor may be substituted for the thermistor 8.

What is claimed is:

1. A resonant circuit comprising:
   a quartz element surface mounted on a first portion of a substrate; and
   a reactance circuit surface mounted on a second portion of said substrate, electrically connected to said quartz element by a circuit pattern, and having a primary temperature coefficient which reduces a width over which a serial resonance frequency-to-temperature characteristic of said quartz element varies with temperature, said quartz element being sealed and said reactance circuit being exposed to ambient so that a reactance of said reactance circuit varies with ambient temperature.

2. A resonant circuit as claimed in claim 1, wherein said quartz element and said reactance circuit are connected one of serially and in parallel.

3. A resonant circuit as claimed in claim 1, wherein said reactance circuit comprises one of a capacitor and a coil.

4. A resonant circuit as claimed in claim 1, wherein said reactance circuit comprises a parallel combination of a capacitor, a resistor and a thermistor.

5. A resonant circuit as claimed in claim 1, wherein said primary temperature coefficient is approximately zero.

6. A resonant circuit comprising:
   a quartz element mounted on a first portion of a substrate;
   one of a capacitor and a coil mounted on a second portion of said substrate;
   an electrode pattern disposed on said substrate and which electrically connects said quartz element to said one of capacitor and coil, and connects said quartz element and said one of capacitor and coil to input/output terminals;
   through holes formed in end portions of said first and second substrate patters for connecting said input/output terminals to said electrode pattern;
   a seam ring located around said quartz element on said first substrate portion; and
   a cover mounted on said seam ring and air-tight sealing said quartz element on said first substrate portion while leaving said one of capacitor and coil on said second substrate portion exposed to ambient.

7. A resonant circuit as claimed in claim 6, wherein said one of capacitor and coil have a primary temperature coefficient of approximately zero.

8. A resonant circuit for surface mounted application, comprising:
   a quartz element mounted on a first portion of a substrate;
   a reactance element;
   a resistor; and
   a thermistor;
   wherein a reactance circuit consists of said reactance element, said resistor and said thermistor being mounted to a second portion of said substrate and displaying a primary temperature coefficient capable of reducing a width over which a serial resonance frequency-to-temperature characteristic of said quartz element varies with temperature, wherein said reactance circuit is electrically connected to said quartz element via a circuit-pattern disposed on said substrate, and wherein said quartz element is air-tightly sealed and said reactance circuit is exposed to ambient, and wherein first and second I/O terminals extend through via through holes located at respective ends of said first and second substrate portions to electrically connect the I/O terminals to said circuit pattern.

9. A resonant circuit as claimed in claim 8, wherein said reactance element, said resistor and said thermistor are connected in a parallel.

10. A resonant circuit as claimed in claim 8, wherein said primary temperature coefficient is approximately zero.

11. A resonant circuit for surface mounting applications, comprising:
    a quartz element mounted on a first portion of a substrate;
    one of a capacitor and a coil mounted on a second portion of said substrate;
    a thermistor mounted on said second portion of said substrate;
    a first electrode pattern which electrically connects said quartz element in said first substrate portion to said one of capacitor and coil in said second substrate portion, and connects said quartz element and said one of capacitor and coil to input/output terminals;
    through holes formed in end portions of said first and second substrate portions allowing electrical collection of said first electrode pattern to an I/O terminal;
    a seam ring located around said quartz element on said first substrate portion;
    a second electrode pattern formed in parallel with a portion of said first electrode pattern disposed on said second substrate portion, said second electrode pattern electrically connecting said thermistor to one of said capacitor and coil; and
    a cover mounted on said seam ring for air-tight sealing said quartz element on said first substrate portion while leaving said thermistor and said one of capacitor and coil on said second electrode pattern exposed to ambient.

12. A resonant circuit as claimed in claim 11, wherein said thermistor and said one of capacitor and coil are connected in a parallel.

13. A resonant circuit as claimed in claim 11, wherein said one of capacitor and coil have a primary temperature coefficient of approximately zero.

14. A resonant circuit for surface mounting applications, comprising:
    a substrate including a first portion and a second portion;
    a leadless quartz element provided on said first portion of said substrate;
    a chip capacitor provided on said second portion of said substrate for temperature compensation of said quartz element;
    a circuit pattern disposed upon and extending from said first substrate portion to said second substrate portion to electrically connect said quartz element to said chip capacitor; and
    a seal member for further, and air-tight sealing said leadless quartz element on said first substrate portion while leaving said chip capacitor on said second substrate portion exposed to ambient.

15. A resonant circuit as claimed in claim 14, wherein said chip capacitor has a primary temperature coefficient of approximately zero.

16. A resonant circuit for surface mounted applications, comprising:

a substrate;

a leadless quartz element provided on a first portion of said substrate;

a chip capacitor provided on a second portion of said substrate for temperature compensation of said quartz element;

a resistor and a thermistor provided on said second portion of said substrate;

a circuit pattern disposed upon and extending from said first portion to said second portion to electrically connect said quartz element to said chip capacitor, wherein first and second through holes extend through said first and second portions, respectively, to enable first and second I/O terminals to pass therethrough to connect said circuit pattern; and a seal member for air-tight sealing said first portion of said substrate while leaving said second portion of said substrate exposed to ambient.

17. A resonant circuit as claimed in claim 16, wherein said chip capacitor, said resistor and said thermistor are connected in a parallel.

18. A resonant circuit as claimed in claim 16, wherein said chip capacitor has a primary temperature coefficient of approximately zero.

\* \* \* \* \*

UNITED STATES PATENT AND TRADEMARK OFFICE
CERTIFICATE OF CORRECTION

PATENT NO. : 5,952,894
DATED : September 14, 1999
INVENTOR(S) : Eiichi Fukiharu

It is certified that error appears in the above-identified patent and that said Letters Patent is hereby corrected as shown below:

Column 2,
Line 6, "A-A" should read -- 2-2 --
Line 24, "B-B" should read --9-9--

Column 4,
Line 30, "301 are" should read --301, the quartz element 1 is connected to the parallel combination of the capacitor 2, and thermistor 8 and a resistor 18,... --

Column 5,
Line 5, "coil 1" should read -- coil --

Claim 6, column 5,
Line 45, "patters" should read -- patterns --

Signed and Sealed this

Thirtieth Day of October, 2001

Attest:

NICHOLAS P. GODICI
Attesting Officer — Acting Director of the United States Patent and Trademark Office